(12) United States Patent
Kuwada et al.

(10) Patent No.: US 12,512,339 B2
(45) Date of Patent: Dec. 30, 2025

(54) TEMPERATURE CONTROL DEVICE AND SUBSTRATE PROCESSING APPARATUS

(71) Applicant: Tokyo Electron Limited, Tokyo (JP)

(72) Inventors: Tomonao Kuwada, Miyagi (JP); Kei Kobayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 636 days.

(21) Appl. No.: 17/828,521

(22) Filed: May 31, 2022

(65) Prior Publication Data
US 2022/0390287 A1 Dec. 8, 2022

(51) Int. Cl.
*H01L 21/67* (2006.01)

(52) U.S. Cl.
CPC ............... *H01L 21/67109* (2013.01)

(58) Field of Classification Search
CPC .......... H01L 21/67109; H01L 21/67248; H01J 37/32724; F25B 29/00
See application file for complete search history.

(56) References Cited

U.S. PATENT DOCUMENTS

| | | | |
|---|---|---|---|
| 2,141,382 A * | 12/1938 | Ferm | C23C 2/36 |
| | | | 118/421 |
| 2014/0262199 A1 | 9/2014 | Kobayashi et al. | |
| 2015/0176928 A1* | 6/2015 | Tabuchi | G05D 23/1951 |
| | | | 165/96 |
| 2015/0316941 A1 | 11/2015 | Silveira et al. | |

FOREIGN PATENT DOCUMENTS

| | | | |
|---|---|---|---|
| CN | 206876020 U | * | 1/2018 |
| JP | 2007220903 A | | 8/2007 |
| JP | 2014021828 A | | 2/2014 |
| JP | 2017091082 A | | 5/2017 |

* cited by examiner

*Primary Examiner* — Eric S Ruppert
(74) *Attorney, Agent, or Firm* — Nath, Goldberg & Meyer; Jerald L. Meyer

(57) ABSTRACT

A temperature control device includes a first tank that stores a first heat medium; a second tank that stores a second heat medium having a temperature different from a temperature of the first heat medium, and a first communication pipe configured to connect a position where an upper limit level of a height of a liquid level is located in an interior of the first tank and a position where a lower limit level of a height of a liquid level is located in an interior of the second tank.

7 Claims, 7 Drawing Sheets

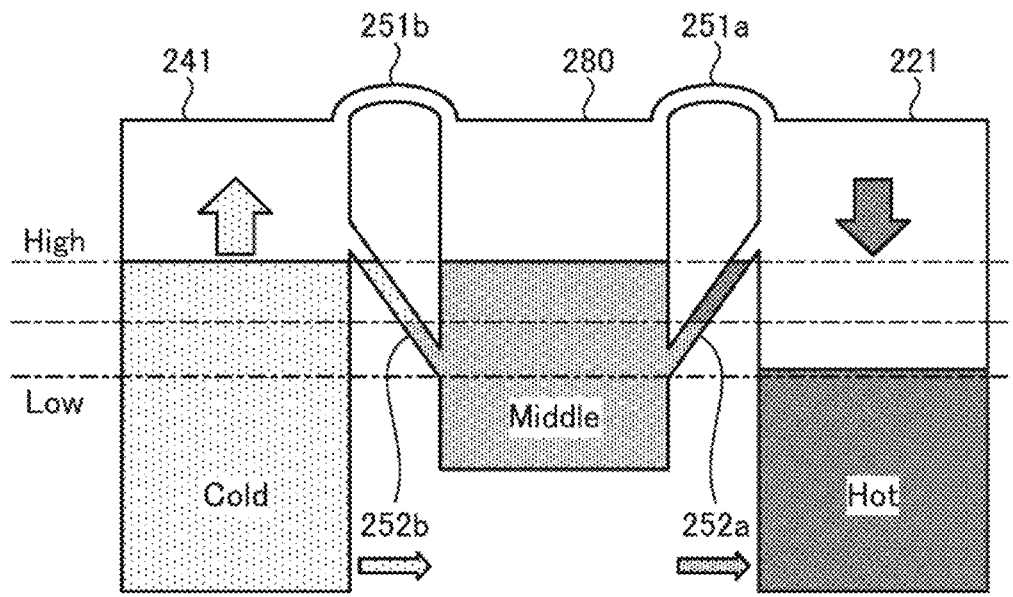
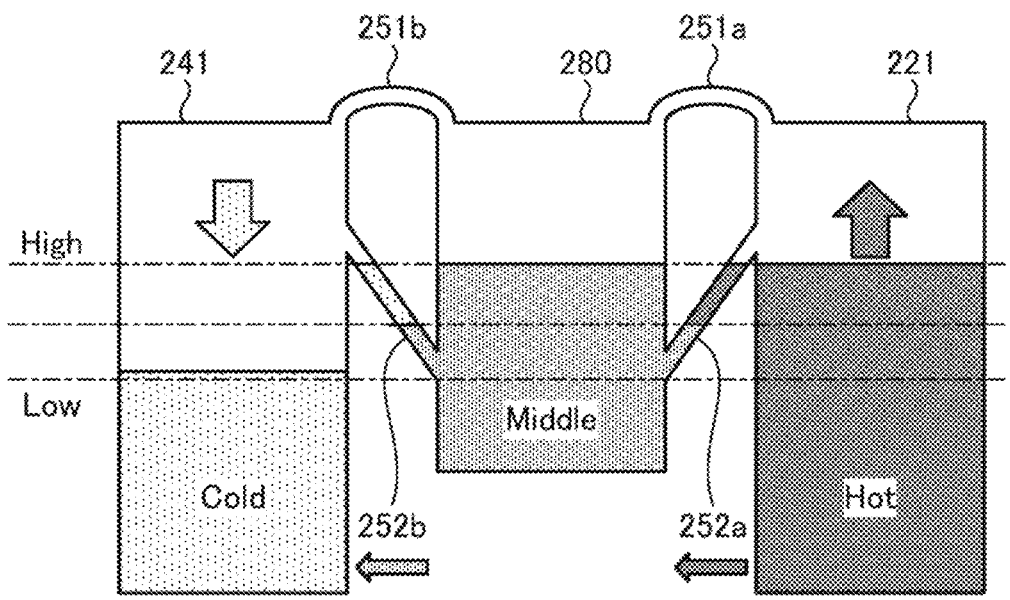

TEMPERATURE CONTROL DEVICE AND SUBSTRATE PROCESSING APPARATUS

CROSS-REFERENCE TO RELATED APPLICATION

This application is based upon and claims the benefit of priority from Japanese Patent Application No. 2021-093164, filed on Jun. 2, 2021, the entire contents of which are incorporated herein by reference.

TECHNICAL FIELD

The present disclosure relates to a temperature control device and a substrate processing apparatus.

BACKGROUND

In a substrate processing apparatus, a chiller that performs temperature control by supplying a high-temperature heat medium and a low-temperature heat medium to a flow path inside a stage by a pump and circulating them through the flow path may be often used. In this type of chiller, it has been proposed to provide a liquid level adjustment tank system in which tanks that store a heat medium are used on the high temperature side and the low temperature side, respectively, and communication is made between the high temperature side tank and the low temperature side tank for liquid level control (Patent Document 1). Further, it has been proposed to connect tanks on the high temperature side and the low temperature side with a passive leveling pipe that makes the tanks the same level (Patent Document 2).

PRIOR ART DOCUMENT

Patent Document

Patent Document 1: U.S. Patent Application Publication No. 2014/0262199
Patent Document 2: U.S. Patent Application Publication No. 2015/0316941

SUMMARY

According to one embodiment of the present disclosure, there is provided a temperature control device including: a first tank that stores a first heat medium; a second tank that stores a second heat medium having a temperature different from a temperature of the first heat medium; and a first communication pipe configured to connect a position where an upper limit level of a height of a liquid level is located in an interior of the first tank and a position where a lower limit level of a height of a liquid level is located in an interior of the second tank.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a diagram showing an example of a change in liquid level at the time of temperature increase in the first modification.

FIG. 8 is a diagram showing an example of a change in liquid level at the time of temperature decrease in the first modification.

DETAILED DESCRIPTION

Hereinafter, embodiments of a temperature control device and a substrate processing apparatus described herein will be described in detail with reference to the drawings. The disclosed techniques are not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When a heat medium is stored in a high temperature side tank and a low temperature side tank, it is required to control a liquid level of the tanks to fall within an appropriate range so that the heat medium does not overflow or a pump runs idle due to lack of liquid quantity. Therefore, by connecting bottoms and ceiling surfaces of the tanks with communication pipes, the heat medium and a gas in each tank can be exchanged. However, when the tanks with a large temperature difference are connected by the communication pipes, since the heat medium moves so as to match the liquid level every time a return circulation liquid quantity becomes non-uniform, large energy loss will continue to occur to maintain the temperature of the heat medium at a set temperature. Examples of the causes of non-uniformity of the return circulation liquid quantity may include a volume change due to a temperature change of the heat medium, a switching operation of a check valve or a valve, evaporation of the heat medium in the high temperature side tank and liquefaction of the heat medium in the low temperature side tank, pulsation of a circulation pump, and so on. Therefore, it is required to reduce the energy loss for maintaining the temperature of heat media having a large temperature difference between the tanks connected by the communication pipes.

[Configuration of Substrate Processing Apparatus 1]

Figure 1:
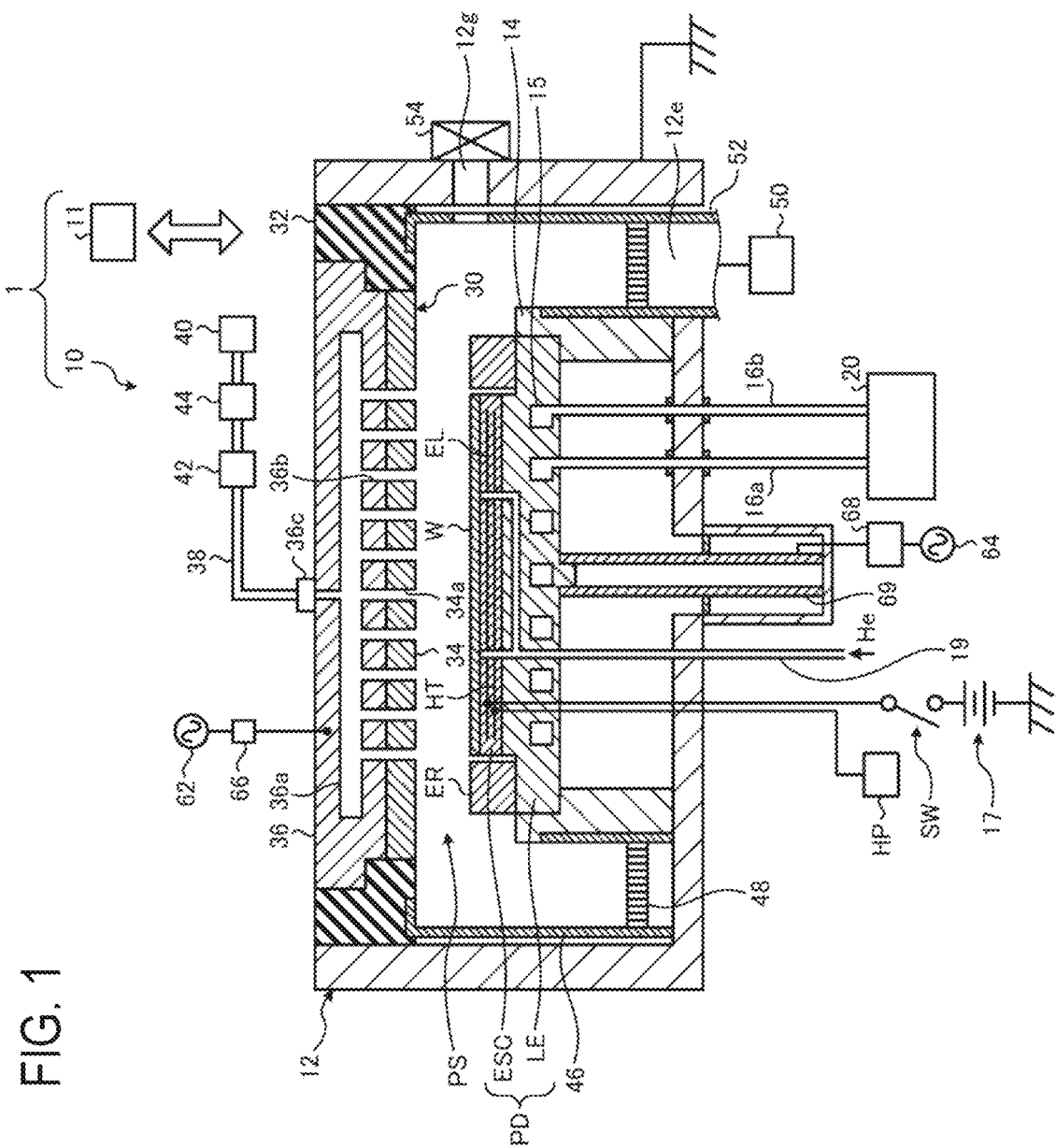
FIG. 1 is a schematic cross-sectional view showing an example of a substrate processing apparatus according to an embodiment of the present disclosure.

FIG. 1 is a schematic cross-sectional view showing an example of a substrate processing apparatus according to an embodiment of the present disclosure. The substrate processing apparatus 1 is, for example, a plasma etching apparatus including electrodes of parallel flat plates. The substrate processing apparatus 1 includes an apparatus main body 10 and a control device 11. The apparatus main body 10 includes a process container 12 which is made of, for example, a material such as aluminum and has, for example, substantially a cylindrical shape. An inner wall surface of the process container 12 has been anodized. Further, the process container 12 has been grounded for safety.

Substantially a cylindrical support part 14 made of, for example, an insulating material such as quartz is provided on the bottom of the process container 12. The support part 14 extends inside the process container 12 vertically (for example, toward an upper electrode 30) from the bottom of the process container 12.

A stage PD is provided inside the process container 12. The stage PD is supported by the support part 14. The stage PD holds a wafer W on the upper surface of the stage PD. The wafer W is an example of a temperature control object. The stage PD includes an electrostatic chuck ESC and a lower electrode LE. The lower electrode LE is made of, for example, a metal material such as aluminum and has substantially a disk shape. The electrostatic chuck ESC is arranged on the lower electrode LE. The lower electrode LE is an example of a heat exchange member that exchanges heat with the temperature control object.

The electrostatic chuck ESC has a structure in which an electrode EL, which is a conductive film, is arranged between a pair of insulating layers or between a pair of insulating sheets. A DC power supply 17 is electrically connected to the electrode EL via a switch SW. The electrostatic chuck ESC attracts the wafer W to the upper surface of the electrostatic chuck ESC by an electrostatic force such as a Coulomb force generated by a DC voltage supplied from the DC power supply 17. As a result, the electrostatic chuck ESC can hold the wafer W.

A heat transfer gas such as a He gas is supplied to the electrostatic chuck ESC via a pipe 19. The heat transfer gas supplied via the pipe 19 is supplied between the electrostatic chuck ESC and the wafer W. By adjusting a pressure of the heat transfer gas supplied between the electrostatic chuck ESC and the wafer W, a thermal conductivity between the electrostatic chuck ESC and the wafer W can be adjusted.

Further, a heater HT, which is a heating element, is provided inside the electrostatic chuck ESC. A heater power supply HP is connected to the heater HT. By supplying electric power from the heater power supply HP to the heater HT, the wafer W on the electrostatic chuck ESC may be heated via the electrostatic chuck ESC. The temperature of the wafer W placed on the electrostatic chuck ESC is adjusted by the lower electrode LE and the heater HT. The heater HT may be arranged between the electrostatic chuck ESC and the lower electrode LE.

An edge ring ER is arranged around the electrostatic chuck ESC so as to surround the edge of the wafer W and the electrostatic chuck ESC. The edge ring ER is sometimes called a focus ring. The edge ring ER may improve the in-plane uniformity of processing on the wafer W. The edge ring ER is composed of a material such as quartz appropriately selected depending on the material of a film to be etched.

A flow path 15 through which a heat medium, which is an insulating fluid such as Galden®, flows is formed inside the lower electrode LE. The heat medium may be expressed as brine. A temperature control device 20 is connected to the flow path 15 via a pipe 16a and a pipe 16b. The temperature control device 20 controls a temperature of the heat medium flowing in the flow path 15 of the lower electrode LE. The heat medium whose temperature is controlled by the temperature control device 20 is supplied into the flow path 15 of the lower electrode LE via the pipe 16a. The heat medium flowed in the flow path 15 is returned to the temperature control device 20 via the pipe 16b.

The temperature control device 20 circulates the heat medium flowing in the flow path 15 of the lower electrode LE. Further, the temperature control device 20 mixes the heat medium having a first temperature or the heat medium having a second temperature with the circulating heat medium and supplies the mixed heat medium into the flow path 15 of the lower electrode LE. The temperature of the lower electrode LE is controlled to a set temperature by mixing the heat medium having the first temperature or the heat medium having the second temperature with the circulating heat medium and supplying the mixed heat medium into the flow path 15 of the lower electrode LE. The first temperature is, for example, a temperature of room temperature or higher, and the second temperature is, for example, a temperature of 0 degrees C. or lower. Hereinafter, the heat medium having the first temperature will be referred to as a first heat medium, and the heat medium having the second temperature will be referred to as a second heat medium. The first heat medium and the second heat medium are fluids of the same material but at different temperatures. The temperature control device 20 and the control device 11 are examples of a heat medium control device.

A feeding pipe 69 for supplying radio frequency power to the lower electrode LE is electrically connected to the lower surface of the lower electrode LE. The feeding pipe 69 is made of metal. Further, although not shown in FIG. 1, lifter pins for delivering the wafer W on the electrostatic chuck ESC, a drive mechanism thereof, and the like, are arranged in a space between the lower electrode LE and the bottom of the process container 12.

A first radio frequency power supply 64 is connected to the feeding pipe 69 via a matching device 68. The first radio frequency power supply 64 is a power supply that generates radio frequency power for drawing ions into the wafer W, that is, radio frequency bias power. For example, the first radio frequency power supply 64 generates the radio frequency bias power having a frequency of 400 kHz to 40.68 MHz, for example, a frequency of 13.56 MHz. The matching device 68 is a circuit for matching an output impedance of the first radio frequency power supply 64 with an input impedance on a load (the lower electrode LE) side. The radio frequency bias power generated by the first radio frequency power supply 64 is supplied to the lower electrode LE via the matching device 68 and the feeding pipe 69.

The upper electrode 30 is provided above the stage PD and at a position facing the stage PD. The lower electrode LE and the upper electrode 30 are arranged so as to be substantially parallel to each other. Plasma is generated in a space between the upper electrode 30 and the lower electrode LE, and plasma treatment such as etching is performed on the wafer W held on the upper surface of the electrostatic chuck ESC by the generated plasma. The space between the upper electrode 30 and the lower electrode LE is a processing space PS.

The upper electrode 30 is supported on the upper portion of the process container 12 via an insulating shielding member 32 made of, for example, quartz. The upper electrode 30 includes an electrode plate 34 and an electrode support 36. The lower surface of the electrode plate 34 faces the processing space PS. A plurality of gas discharge ports 34a are formed in the electrode plate 34. The electrode plate 34 is made of a material containing, for example, silicon.

The electrode support 36 is made of a conductive material such as aluminum and detachably supports the electrode plate 34 from above. The electrode support 36 may include a water-cooled structure (not shown). A diffusion chamber 36a is formed inside the electrode support 36. A plurality of gas flow ports 36b communicating with the gas discharge ports 34a of the electrode plate 34 extend downward (toward the stage PD) from the diffusion chamber 36a. The electrode support 36 is provided with a gas introduction port 36c for guiding a process gas to the diffusion chamber 36a, and a pipe 38 is connected to the gas introduction port 36c.

A gas source group 40 is connected to the pipe 38 via a valve group 42 and a flow rate controller group 44. The gas source group 40 includes a plurality of gas sources. The valve group 42 includes a plurality of valves, and the flow rate controller group 44 includes a plurality of flow rate controllers such as mass flow controllers. Each gas source of the gas source group 40 is connected to the pipe 38 via a corresponding valve in the valve group 42 and a corresponding flow rate controller in the flow rate controller group 44.

Thus, the apparatus main body 10 is able to supply the process gas from one or more gas sources selected in the gas source group 40 into the diffusion chamber 36a in the electrode support 36 at an individually-adjusted flow rate. The process gas supplied into the diffusion chamber 36a diffuses in the diffusion chamber 36a and is supplied in the form of a shower into the processing space PS via the respective gas flow ports 36b and gas discharge ports 34a.

A second radio frequency power supply 62 is connected to the electrode support 36 via a matching device 66. The second radio frequency power supply 62 is a power supply that generates radio frequency power for plasma generation, and generates radio frequency power having a frequency of 27 to 100 MHz, for example, a frequency of 60 MHz. The matching device 66 is a circuit for matching an output impedance of the second radio frequency power supply 62 with an input impedance on a load (the upper electrode 30) side. The radio frequency power generated by the second radio frequency power supply 62 is supplied to the upper electrode 30 via the matching device 66. The second radio frequency power supply 62 may be connected to the lower electrode LE via the matching device 66.

A deposition shield 46 whose surface is made of aluminum or the like coated with $Y_2O_3$, quartz, or the like is detachably provided on the inner wall surface of the process container 12 and the outer surface of the support part 14. The deposition shield 46 can prevent etching by-products (deposits) from adhering to the process container 12 and the support part 14.

An exhaust plate 48 whose surface is made of aluminum or the like coated with $Y_2O_3$, quartz, or the like is provided between an outer sidewall of the support part 14 and an inner sidewall of the process container 12 and on the bottom side (the side where the support part 14 is installed) of the process container 12. An exhaust port 12e is provided below the exhaust plate 48. An exhaust device 50 is connected to the exhaust port 12e via an exhaust pipe 52.

The exhaust device 50 includes a vacuum pump such as a turbo molecular pump and may reduce an internal space of the process container 12 to a desired degree of vacuum. The sidewall of the process container 12 is provided with an opening 12g for loading or unloading the wafer W therethrough. The opening 12g may be opened/closed by a gate valve 54.

The control device 11 includes a processor, a memory, and an input/output interface. The memory stores a program executed by the processor and a recipe including conditions for each process. The processor executes the program read from the memory and controls each part of the apparatus main body 10 via the input/output interface based on the recipe stored in the memory, thereby performing a predetermined process such as etching on the wafer W. The control device 11 is an example of a controller.

[Configuration of Temperature Control Device 20]

Figure 2:
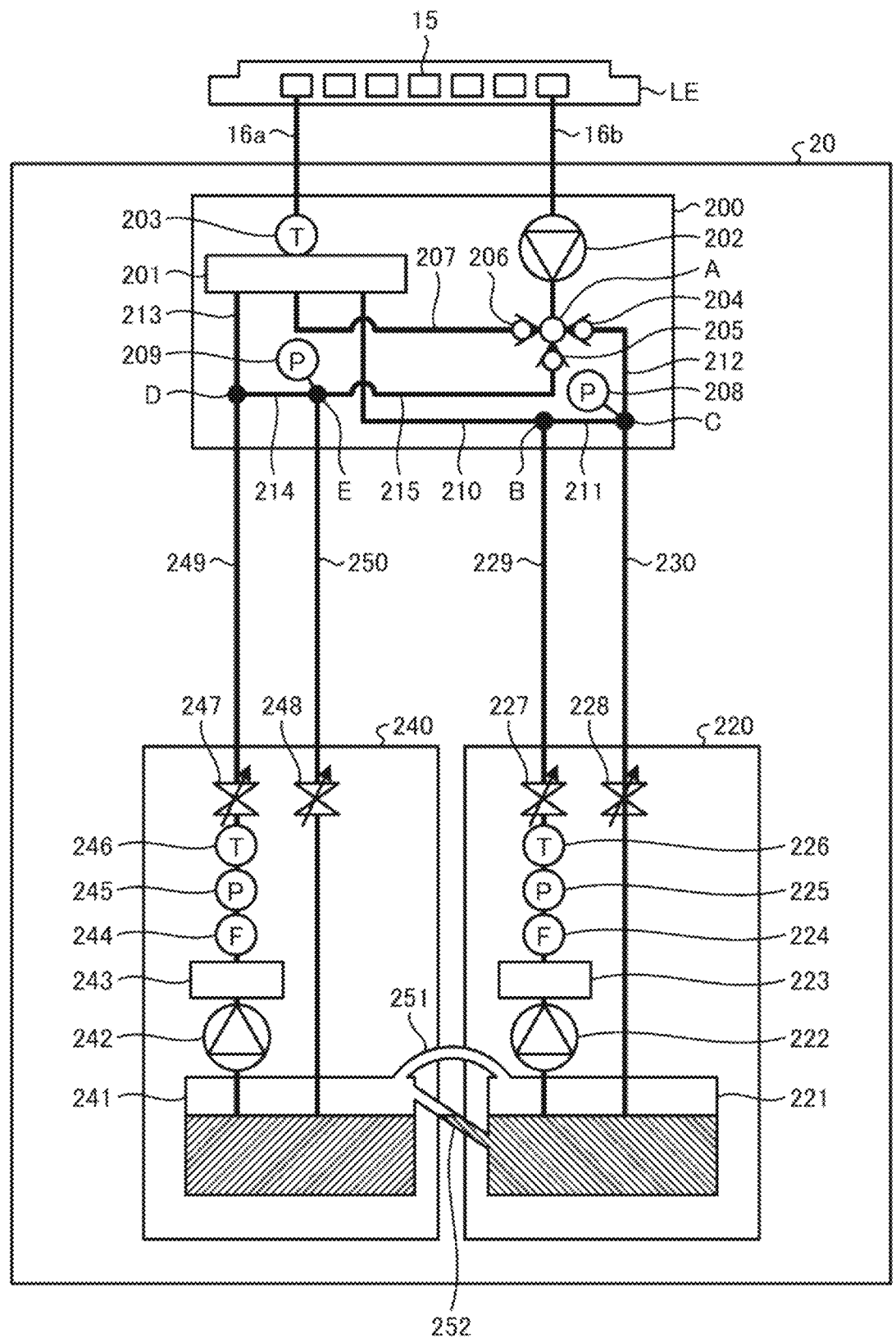
FIG. 2 is a diagram showing an example of a temperature control device according to the present embodiment.

FIG. 2 is a diagram showing an example of the temperature control device according to the present embodiment. The temperature control device 20 includes a circulation part 200, a first temperature controller 220, and a second temperature controller 240. For example, the circulation part 200 is installed on the same floor as a floor where the process container 12 is installed, and the first temperature controller 220 and the second temperature controller 240 are installed on a floor below the circulation part 200.

In the circulation part 200, an outlet side of a valve 201 is connected to the pipe 16a. Further, in the circulation part 200, a pump 202 for circulating the heat medium flowing in the flow path 15 of the lower electrode LE is connected to the pipe 16b. The pipe 16b on the outlet side of the pump 202 is connected to an inlet side of the valve 201 via a check valve 206 and a pipe 207 at a connection position A. Since a pressure of the pipe 207 is lower than a pressure of the pipe 16b on the outlet side of the pump 202 during the operation of the pump 202, the check valve 206 opens. Therefore, the heat medium circulates in a path of the pump 202, the pipe 16b, the check valve 206, the pipe 207, the valve 201, the pipe 16a, the flow path 15, and the pipe 16b. The pipe 207 is an example of a third pipe. Further, the pipe 16a in the circulation part 200 is provided with a temperature sensor 203 for detecting the temperature on the inlet side of the flow path 15. The temperature sensor 203 may be provided outside the temperature control device 20. For example, the temperature sensor 203 may be provided directly under the lower electrode LE, for example, at a connection portion between the pipe 16a and the flow path 15, or may be provided at an intermediate point between the lower electrode LE and the temperature control device 20.

The first temperature controller 220 is connected to the pipe 16a via a pipe 229, a pipe 210, and the valve 201. Further, the first temperature controller 220 is connected to the pipe 16b via a pipe 230, a pipe 212, and a check valve 204. A connection position B between the pipe 229 and the pipe 210 and a connection position C between the pipe 230 and the pipe 212 are connected by a pipe 211 which is a bypass pipe. A pressure sensor 208 for monitoring is provided at the connection position C.

In the present embodiment, the first temperature controller 220 controls the temperature of the first heat medium. The first temperature controller 220 mixes the temperature-controlled first heat medium with the heat medium circulating from the pipe 207 to the pipe 16a via the pipe 229, the pipe 210, and the valve 201, and supplies the mixed heat medium into the flow path 15 of the lower electrode LE. The temperature of the first heat medium may be, for example, 90 degrees C., which is higher than the temperature of the second heat medium. The temperature of the first heat medium may be any degrees C. as long as it is higher than the temperature of the second heat medium. The internal pressures of the pipes 210 to 212, 229, 230 are lowered by supplying the first heat medium into the flow path 15 of the lower electrode LE. Then, the heat medium discharged from the flow path 15 passes through the check valve 204 opened due to a partial pressure drop at the connection position A of the pipe 16b, and is returned to the first temperature controller 220 via the pipe 212 and the pipe 230. A pipe composed of the pipe 229, the pipe 210, and the pipe 16a is an example of a supply pipe or a first supply pipe. Further, a pipe composed of the pipe 16b, the pipe 212, and the pipe 230 is an example of a return pipe or a first return pipe. Further, a pipe composed of the pipes 210 to 212, 229, 230 is an example of a first pipe.

The first temperature controller 220 supplies the heat medium in a reservoir tank 221 to the pipe 229 by a pump 222. Further, a heat exchanger 223, a flow rate sensor 224, a pressure sensor 225, a temperature sensor 226, and a variable valve 227 are provided on the outlet side of the pump 222. That is, the heat exchanger 223, the flow rate sensor 224, the pressure sensor 225, the temperature sensor 226, and the variable valve 227 are provided immediately after the pump 222. The heat exchanger 223 heats or cools the heat medium supplied to the pipe 229 to a set temperature. The flow rate sensor 224 detects a flow rate of the heat medium supplied by the pump 222 on the sending side of the pipe 229. The pressure sensor 225 detects a pressure of the heat medium supplied by the pump 222 on the sending side of the pipe 229. The temperature sensor 226 detects a temperature of the heat medium supplied by the pump 222 on the sending side of the pipe 229. The variable valve 227 adjusts a pressure of the heat medium supplied by the pump 222 in the pipe 229, together with a variable valve 228 on the side of the pipe 230 which is the return pipe.

The second temperature controller 240 is connected to the pipe 16a via a pipe 249, a pipe 213, and the valve 201. Further, the second temperature controller 240 is connected to the pipe 16b via a pipe 250, a pipe 215, and a check valve 205. A connection position D between the pipe 249 and the pipe 213 and a connection position E between the pipe 250 and the pipe 215 are connected by a pipe 214 which is a bypass pipe. A pressure sensor 209 for monitoring is provided at the connection position E.

In the present embodiment, the second temperature controller 240 controls a temperature of the second heat medium. The second temperature controller 240 mixes the temperature-controlled second heat medium with the heat medium circulating from the pipe 207 to the pipe 16a via the pipe 249, the pipe 213, and the valve 201, and supplies the mixed heat medium into the flow path 15 of the lower electrode LE. The temperature of the second heat medium may be, for example, −10 degrees C., which is lower than the temperature of the first heat medium. The temperature of the second heat medium may be any degrees C. as long as it is lower than the temperature of the first heat medium. The internal pressures of the pipes 213 to 215, 249, and 250 are lowered by supplying the second heat medium into the flow path 15 of the lower electrode LE. Then, the heat medium discharged from the flow path 15 passes through the check valve 205 opened due to a partial pressure drop at the connection position A of the pipe 16b, and is returned to the second temperature controller 240 via the pipe 215 and the pipe 250. A pipe composed of the pipe 249, the pipe 213, and the pipe 16a is an example of a supply pipe or a second supply pipe. Further, a pipe composed of the pipe 16b, the pipe 215, and the pipe 250 is an example of a return pipe or a second return pipe. Further, a pipe composed of the pipes 213 to 215, 249, and 250 is an example of a second pipe.

The second temperature controller 240 supplies the heat medium in a reservoir tank 241 to the pipe 249 by a pump 242. Further, a heat exchanger 243, a flow rate sensor 244, a pressure sensor 245, a temperature sensor 246, and a variable valve 247 are provided on the outlet side of the pump 242. That is, the heat exchanger 243, the flow rate sensor 244, the pressure sensor 245, the temperature sensor 246, and the variable valve 247 are provided immediately after the pump 242. The heat exchanger 243 heats or cools the heat medium supplied to the pipe 249 to a set temperature. The flow rate sensor 244 detects a flow rate of the heat medium supplied by the pump 242 on the sending side of the pipe 249. The pressure sensor 245 detects a pressure of the heat medium supplied by the pump 242 on the sending side of the pipe 249. The temperature sensor 246 detects a temperature of the heat medium supplied by the pump 242 on the delivery side of the pipe 249. The variable valve 247 adjusts a pressure of the heat medium supplied by the pump 242 in the pipe 249, together with a variable valve 248 on the side of the pipe 250 which is the return pipe.

The reservoir tank 221 of the first temperature controller 220 and the reservoir tank 241 of the second temperature controller 240 are connected by pipes 251 and 252. The pipes 251 and 252 are an example of a communication pipe and adjust a liquid level of the reservoir tank 221 that stores the first heat medium and a liquid level of the reservoir tank 241 that stores the second heat medium. The pipe 251 is a pipe for mutual movement of a gas (air, evaporated heat medium, or the like) between the reservoir tanks 221 and 241. The pipe 252 is a pipe for mutual movement of a liquid (heat medium) between the reservoir tanks 221 and 241. As a result, leakage of the heat medium is prevented.

The opening degrees of the valves 2011, 227, 228, 247, and 248, the sending pressures of the pumps 202, 222, and 242, and the temperatures in the heat exchangers 223 and 243 are controlled by the control device 11. Further, the pumps 202, 222, and 242 are pumps whose sending pressures can be controlled according to an inverter frequency. The opening degree of the valve 201 may be adjusted, for example, between +100% and −100%. At a position where the opening degree of the valve 201 is 0%, the entire amount of heat medium from the pipe 207 flows into the pipe 16a, and the heat medium from the pipe 210 and the pipe 213 does not flow into the pipe 16a. Further, at a position where the opening degree of the valve 201 is +100%, the entire amount of heat medium from the pipe 210 flows into the pipe 16a, and the heat medium from the pipe 207 and the pipe 213 does not flow into the pipe 16a. On the other hand, when the opening degree of the valve 201 is −100%, the entire amount of heat medium from the pipe 213 flows into the pipe 16a, and the heat medium from the pipe 207 and the pipe 210 does not flow into the pipe 16a.

That is, when it is desired to raise the temperature of the circulating heat medium mixed with the first heat medium on the high temperature side, the opening degree of the valve 201 is changed from the 0% position to the positive position. On the other hand, when it is desired to lower the temperature of the circulating heat medium mixed with the second heat medium on the low temperature side, the opening degree of the valve 201 is changed from the 0% position to the negative position. For example, when plasma is ignited in the processing space PS to perform plasma treatment, heat is also input from the plasma to the lower electrode LE. Therefore, in order to keep the temperature of the lower electrode LE constant, for example, the opening degree of the valve 201 is set to −10%, the flow rate of the heat medium circulating in the pipe 207 is set to 90%, and the second heat medium on the low temperature side of the pipe 213 is mixed by 10%.

[Configuration of Communication Pipe]

Figure 3:
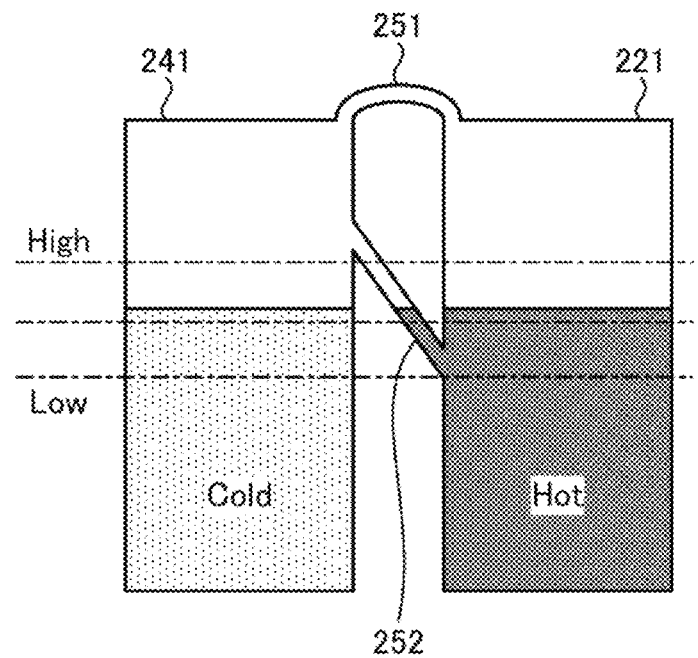
FIG. 3 is a diagram showing an example of a configuration of a communication pipe connecting tanks in the present embodiment.

Next, a configuration of the communication pipe according to the present embodiment will be described. FIG. 3 is a diagram showing an example of the configuration of the communication pipe connecting the tanks in the present embodiment.

As shown in FIG. 3, the reservoir tank 221 on the high temperature side and the reservoir tank 241 on the low temperature side are connected by the pipe 251, which is a communication pipe for gas, and the pipe 252 which is a communication pipe for liquid (heat medium). The pipe 251 connects the ceiling surface side of the reservoir tank 221 and the ceiling surface side of the reservoir tank 241. The reservoir tank 221 is an example of a first tank, and the reservoir tank 241 is an example of a second tank.

The height of the liquid level in each of the reservoir tanks 221 and 241 is maintained at an approximately intermediate level between the upper limit level and the lower limit level, which is an appropriate control range of the liquid quantity, when the heat medium is circulated. The appropriate control range defines the amount of heat medium that can stably control the temperature of a temperature control object. In the following description, in FIGS. 3 to 8, the upper limit level is represented as "High" and the lower limit level is represented as "Low." The upper limit level is set to the height of the liquid level that moves the heat medium to one reservoir tank 221 or 241 in order to prevent the heat medium from overflowing from a pressure release valve (not shown) provided on the ceiling surface of the other reservoir tank 241 or 221. The lower limit level is set to the height of the liquid level for ensuring a constant quantity of liquid in the reservoir tanks 221 and 241 in order to prevent the pumps 222 and 242 for supplying the heat medium from running idle.

The pipe 252 connects a position of the lower limit level of the reservoir tank 221 and a position of the upper limit level of the reservoir tank 241. When the heat medium is circulated, the height of the liquid level in the pipe 252 is the same as the height of the liquid level in the reservoir tank 221. Further, the heat medium is in a state of not moving between the reservoir tank 221 and the reservoir tank 241 via the pipe 252. That is, since the heat medium in the reservoir tank 221 on the high temperature side and the heat medium in the reservoir tank 241 on the low temperature side do not mix, energy loss for maintaining the temperatures in the respective heat media having a large temperature difference can be reduced. The pipe 252 may connect the position of the upper limit level of the reservoir tank 221 and the position of the lower limit level of the reservoir tank 241.

Figure 4:
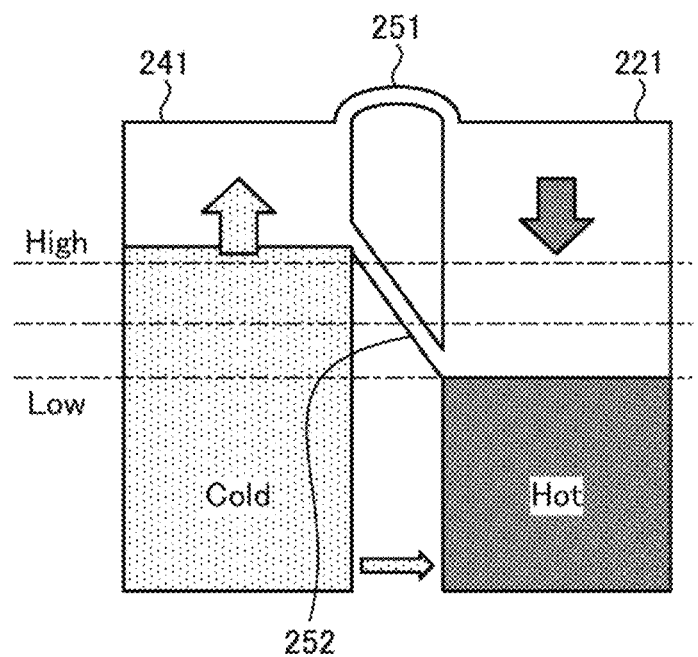
FIG. 4 is a diagram showing an example of a change in liquid level at the time of temperature increase in the present embodiment.

FIG. 4 is a diagram showing an example of a change in liquid level at the time of temperature increase in the present embodiment. As shown in FIG. 4, when the temperature of the lower electrode LE is increased, since the supply of the heat medium on the high temperature side via the pipe 229 is started, the liquid level in the reservoir tank 221 is lowered. On the other hand, the liquid level in the reservoir tank 241 rises because the supply of the heat medium on the low temperature side is stopped. The heat medium in the reservoir tank 241 moves to the reservoir tank 221 via the pipe 252 by an amount exceeding the upper limit level. Therefore, the height of the liquid level in the reservoir tank 221 is maintained at the lower limit level, so that the height of the liquid level in the reservoir tank 241 does not greatly exceed the upper limit level. At this time, since the amount of heat medium that moves from the reservoir tank 241 on low temperature side to the reservoir tank 221 on the high temperature side is limited, the temperature drop of the heat medium in the reservoir tank 221 on the high temperature side can be reduced, thereby reducing the energy loss for keeping the temperature constant.

Figure 5:
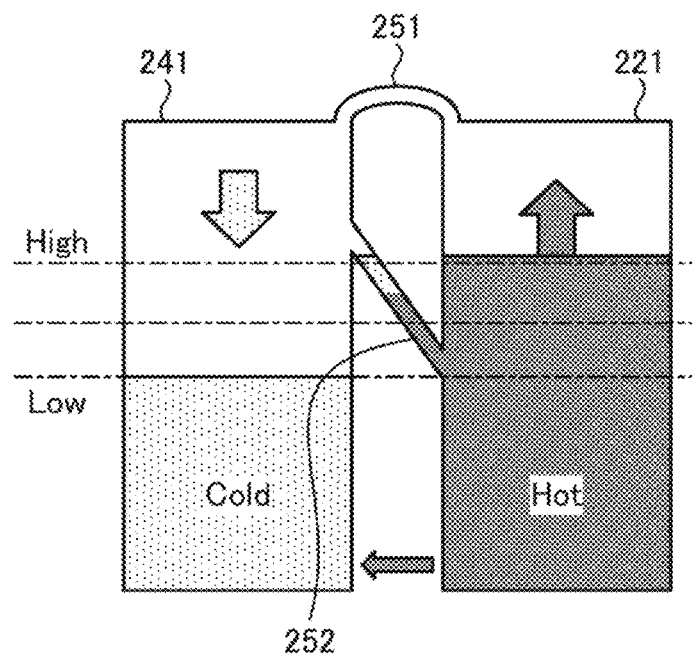
FIG. 5 is a diagram showing an example of a change in liquid level at the time of temperature decrease in the present embodiment.

FIG. 5 is a diagram showing an example of a change in liquid level at the time of temperature decrease in the present embodiment. As shown in FIG. 5, when the temperature of the lower electrode LE is decreased, since the supply of the heat medium on the low temperature side via the pipe 249 is started, the liquid level in the reservoir tank 241 is lowered. On the other hand, the liquid level in the reservoir tank 221 rises because the supply of the heat medium on the high temperature side is stopped. The heat medium in the reservoir tank 221 moves to the reservoir tank 241 via the pipe 252 by an amount exceeding the upper limit level. Therefore, the height of the liquid level in the reservoir tank 241 is maintained at the lower limit level, so that the height of the liquid level in the reservoir tank 221 does not greatly exceed the upper limit level. At this time, since the amount of heat medium that moves from the reservoir tank 221 on the high temperature side to the reservoir tank 241 on the low temperature side is limited, the temperature rise of the heat medium in the reservoir tank 241 on the low temperature side can be reduced, thereby reducing the energy loss for keeping the temperature constant.

[First Modification]

In the above embodiment, the reservoir tank 221 on the high temperature side and the reservoir tank 241 on the low temperature side are directly connected by the pipe 252. However, they may be connected via a tank at the room temperature (a temperature equivalent to the atmosphere around the tank) in the middle. An embodiment in this case will be described as a first modification. Since configurations of some parts of a substrate processing apparatus and a temperature control device in the first modification is the same as those of the above-described embodiment, descriptions of the duplicated configuration and operation will be omitted.

Figure 6:
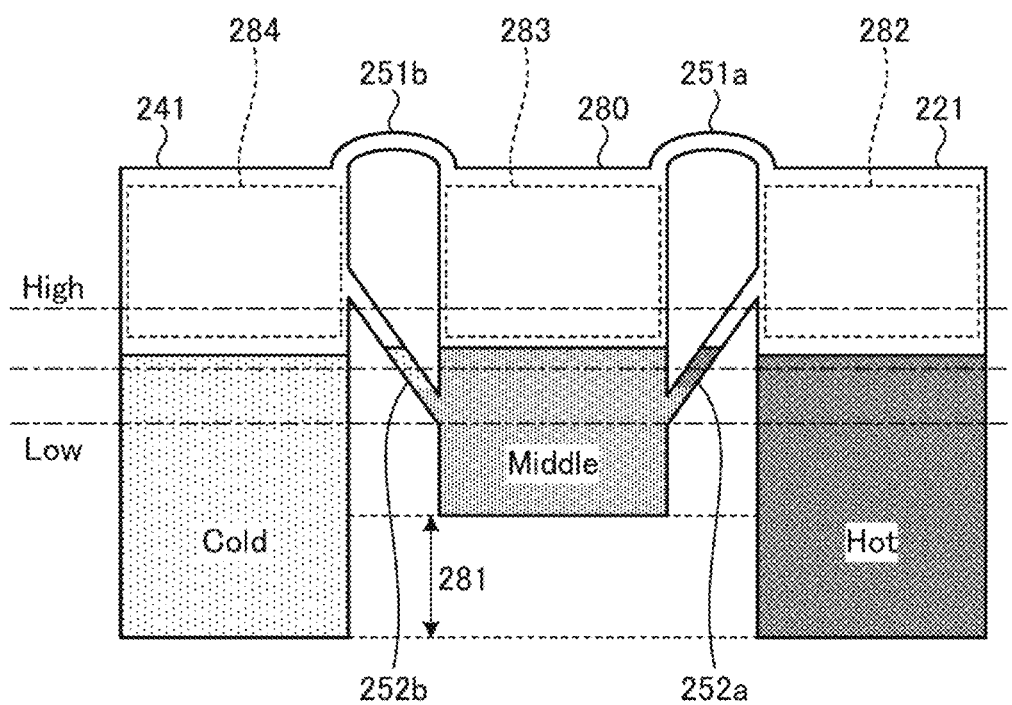
FIG. 6 is a diagram showing an example of a configuration of a communication pipe connecting tanks in a first modification.

FIG. 6 is a diagram showing an example of the configuration of a communication pipe connecting tanks in the first modification. As shown in FIG. 6, in the first modification, a middle tank 280 is provided between the reservoir tank 221 and the reservoir tank 241. The reservoir tank 221 on the high temperature side and the middle tank 280 are connected by a pipe 251a, which is a communication pipe for gas, and a pipe 252a which is a communication pipe for liquid (heat medium). The pipe 251a connects the ceiling surface side of the reservoir tank 221 and the ceiling surface side of the middle tank 280. Further, the reservoir tank 241 on the low temperature side and the middle tank 280 are connected by a pipe 251b, which is a communication pipe for gas, and a pipe 252b which is a communication pipe for liquid (heat medium). The pipe 251b connects the ceiling surface side of the reservoir tank 241 and the ceiling surface side of the middle tank 280.

The temperature of the middle tank 280 is not controlled, and the heat medium inside the middle tank 280 exchanges heat with the outside air through the wall of the middle tank 280 so that the temperature of the heat medium becomes the normal temperature (for example, 20 degrees C.) unless there is an inflow of heat medium from the reservoir tank 221 or the reservoir tank 241. That is, the middle tank 280 stores a third heat medium at the room temperature. The middle tank 280 is an example of a third tank. The bottom of the middle tank 280 is higher than the bottoms of the reservoir tank 221 and the reservoir tank 241. As a result, the liquid level control through the middle tank 280 is realized with the minimum quantity of liquid. The position of the ceiling surface of the middle tank 280 is the same as those of the reservoir tanks 221 and 241. The heights of the liquid levels in the reservoir tanks 221 and 241 and the middle tank 280 are kept at an approximately intermediate level between the upper limit level and the lower limit level during circulation of the heat medium, as in the above-described embodiment.

The pipe 252a connects the position of the upper limit level of the reservoir tank 221 and the position of the lower limit level of the middle tank 280. When the heat medium is circulated, the height of the liquid level in the pipe 252a is the same as the height of the liquid level in the middle tank 280. Further, the heat medium is in a state of not moving between the reservoir tank 221 and the middle tank 280 via the pipe 252a. That is, since the heat medium in the reservoir tank 221 on the high temperature side and the heat medium in the middle tank 280 at the room temperature do not mix, energy loss for maintaining the temperature in the high temperature side heat medium of the heat media having a large temperature difference can be reduced. The pipe 252a may connect the position of the lower limit level of the reservoir tank 221 and the position of the upper limit level of the middle tank 280.

The pipe 252b connects the position of the upper limit level of the reservoir tank 241 and the position of the lower limit level of the middle tank 280. When the heat medium is circulated, the height of the liquid level in the pipe 252b is the same as the height of the liquid level in the middle tank 280. Further, the heat medium is in a state of not moving between the reservoir tank 241 and the middle tank 280 via the pipe 252b. That is, since the heat medium in the reservoir tank 241 on the low temperature side and the heat medium in the middle tank 280 at the room temperature do not mix, energy loss for maintaining the temperature in the low temperature side heat medium of the heat media having a large temperature difference can be reduced. The pipe 252b may connect the position of the lower limit level of the reservoir tank 241 and the position of the upper limit level of the middle tank 280.

In the reservoir tanks 221 and 241 and the middle tank 280, there are spaces 282 to 284 above the liquid level when the heat medium is circulated. The spaces 282 to 284 may be used as tanks for storing the heat medium, for example, during maintenance of the substrate processing apparatus 1. By providing the middle tank 280, even if the capacity of the reservoir tanks 221 and 241 is made small, the same amount of heat medium as in the above-described embodiment may be stored in the reservoir tanks 221 and 241 and the middle tank 280.

FIG. 7 is a diagram showing an example of a change in liquid level at the time of temperature increase in the first modification. As shown in FIG. 7, when the temperature of the lower electrode LE is increased, since the supply of the heat medium on the high temperature side via the pipe 229 is started, the liquid level in the reservoir tank 221 is lowered. On the other hand, the liquid level in the reservoir tank 241 rises because the supply of the heat medium on the low temperature side is stopped. The heat medium in the reservoir tank 241 moves to the middle tank 280 via the pipe 252b by an amount exceeding the upper limit level. When the liquid level in the middle tank 280 rises, the heat medium in the middle tank 280 moves to the reservoir tank 221 via the pipe 252a by an amount exceeding the upper limit level. Therefore, the height of the liquid level in the reservoir tank 221 is maintained at the lower limit level, and the heights of the liquid levels in the reservoir tank 241 and the middle tank 280 do not greatly exceed the upper limit level. At this time, since the heat medium that moves from the reservoir tank 241 on the low temperature side to the reservoir tank 221 on the high temperature side is limited in the amount of movement and once passes through the middle tank 280 at the room temperature, the temperature drop of the heat medium in the reservoir tank 221 on the high temperature side can be made smaller, so that the energy loss for keeping the temperature constant can be made smaller. That is, since the heat medium at the room temperature in the middle tank 280 flows into the reservoir tank 221 on the high temperature side, the energy loss for keeping the temperature constant can be made smaller than that when the low temperature heat medium in the reservoir tank 241 on the low temperature side flows into the reservoir tank 221 on the high temperature side.

FIG. 8 is a diagram showing an example of a change in liquid level at the time of temperature decrease in the first modification. As shown in FIG. 8, when the temperature of the lower electrode LE is decreased, since the supply of the heat medium on the low temperature side via the pipe 249 is started, the liquid level in the reservoir tank 241 is lowered. On the other hand, the liquid level in the reservoir tank 221 rises because the supply of the heat medium on the high temperature side is stopped. The heat medium in the reservoir tank 221 moves to the middle tank 280 via the pipe 252a by an amount exceeding the upper limit level. When the liquid level in the middle tank 280 rises, the heat medium in the middle tank 280 moves to the reservoir tank 241 via the pipe 252b by an amount exceeding the upper limit level. Therefore, the height of the liquid level in the reservoir tank 241 is maintained at the lower limit level, and the heights of the liquid levels in the reservoir tank 221 and the middle tank 280 do not greatly exceed the upper limit level. At this time, since the heat medium that moves from the reservoir tank 221 on the high temperature side to the reservoir tank 241 on the low temperature side is limited in the amount of movement and once passes through the middle tank 280 at the room temperature, the temperature rise of the heat medium in the reservoir tank 241 on the low temperature side can be made smaller, so that the energy loss for keeping the temperature constant can be made smaller. That is, since the heat medium at the room temperature in the middle tank 280 flows into the reservoir tank 241 on the low temperature side, the energy loss for keeping the temperature constant can be made smaller than that when the heat medium at the high temperature in the reservoir tank 221 on the high temperature side flows into the reservoir tank 241 on the low temperature side.

[Second Modification]

In the above embodiment, the position of the lower limit level of the reservoir tank 221 and the position of the upper limit level of the reservoir tank 241 are connected by the pipe 252. However, the reservoir tanks 221 and 241 may be connected by a horizontal pipe with the position of the reservoir tank 221 on the high temperature side shifted in the height direction. An embodiment in this case will be described as a second modification. Since configurations of some parts of a substrate processing apparatus and a temperature control device in the second modification is the same as those of the above-described embodiment, the description of the duplicated configuration and operation will be omitted.

Figure 9:
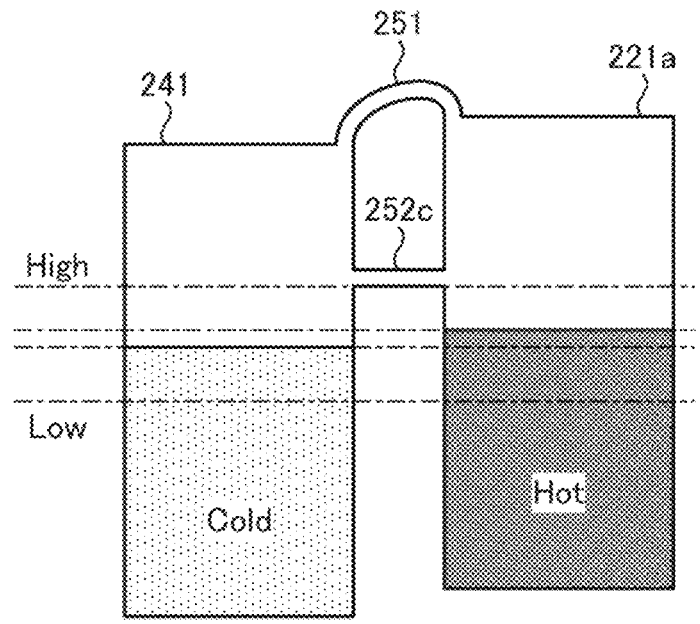
FIG. 9 is a diagram showing an example of the configuration of a communication pipe connecting tanks in a second modification.

FIG. 9 is a diagram showing an example of the configuration of a communication pipe connecting tanks in the second modification. As shown in FIG. 9, in the second modification, the arrangement of the reservoir tank 221 is shifted upward in the height direction to form a reservoir tank 221a. That is, the ceiling surface and the bottom surface of the reservoir tank 221a are higher than those of the reservoir tank 241, respectively. The reservoir tank 221a and the reservoir tank 241 are connected by the pipe 251, which is a communication pipe for gas, and a pipe 252c which is a communication pipe for liquid (heat medium). The pipe 251 connects the ceiling surface side of the reservoir tank 221a and the ceiling surface side of the reservoir tank 241.

The height of the liquid level in the reservoir tank 221a is kept substantially in the middle of an appropriate control range in a state in which the heat medium on the reservoir tank 221a side circulates in the lower electrode LE. The pipe 252c is horizontally connected to the reservoir tank 241 at the position of the upper limit level of the reservoir tank 221a. In the state in which the heat medium in the reservoir tank 221a circulates in the lower electrode LE as shown in FIG. 9, the heat medium does not move between the reservoir tank 221a and the reservoir tank 241 via the pipe 252c. That is, since the heat medium in the reservoir tank 221a on the high temperature side and the heat medium in the reservoir tank 241 on the low temperature side do not mix, energy loss for maintaining the temperatures in the respective heat media having a large temperature difference can be reduced.

Figure 10:
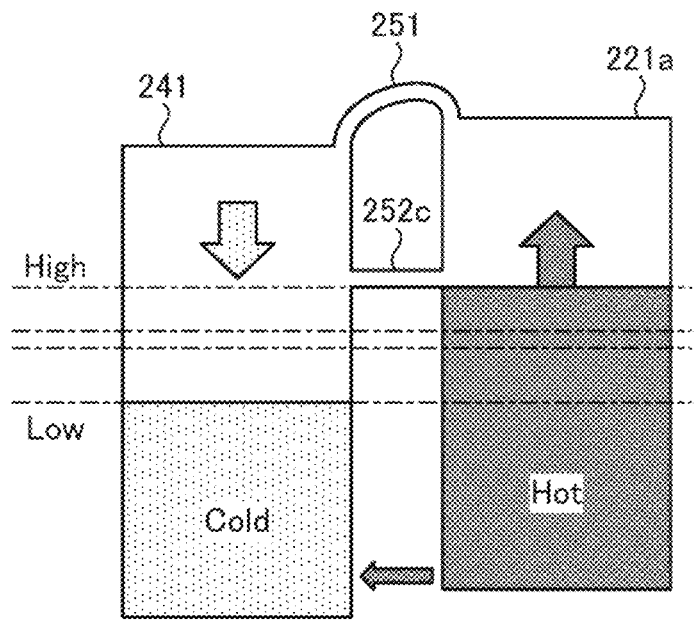
FIG. 10 is a diagram showing an example of a change in liquid level at the time of temperature decrease in the second modification.

FIG. 10 is a diagram showing an example of a change in liquid level at the time of temperature decrease in the second modification. As shown in FIG. 10, when the temperature of the lower electrode LE is decreased, since the supply of the heat medium on the low temperature side via the pipe 249 is started, the liquid level in the reservoir tank 241 is lowered. On the other hand, the liquid level in the reservoir tank 221a rises because the supply of the heat medium on the high temperature side is stopped. The heat medium in the reservoir tank 221a moves to the reservoir tank 241 via the pipe 252c by an amount exceeding the upper limit level. Therefore, the height of the liquid level in the reservoir tank 241 is maintained at the lower limit level, so that the height of the liquid level in the reservoir tank 221a does not greatly exceed the upper limit level. At this time, since the amount of heat medium that moves from the reservoir tank 221a on the high temperature side to the reservoir tank 241 on the low temperature side is limited, the temperature rise of the heat medium in the reservoir tank 241 on the low temperature side can be reduced, thereby reducing the energy loss for keeping the temperature constant.

After that, when the temperature of the lower electrode LE is increased, since the supply of the heat medium on the high temperature side via the pipe 229 is started, the liquid level in the reservoir tank 221a is lowered. On the other hand, the liquid level in the reservoir tank 241 rises because the supply of the heat medium on the low temperature side is stopped. That is, when the heat medium in the reservoir tank 221a returns to the state of circulating in the lower electrode LE, the heights of the liquid levels in the reservoir tank 221a and the reservoir tank 241 also return to approximately the state shown in FIG. 9.

[Third Modification]

In the above embodiment, the temperature control device 20 of a type in which the heat medium circulates in the circulation part 200 has been described, but a temperature control device of a type of switching the heat medium flowing in the flow path 15 in the lower electrode LE between a first heat medium and a second heat medium may be used. An embodiment in this case will be described as a third modification. Since configurations of some parts of a substrate processing apparatus and a temperature control device and a pressure control method in the third modification are the same as those of the above-described embodiment, descriptions of the duplicated configuration and operation will be omitted.

Figure 11:
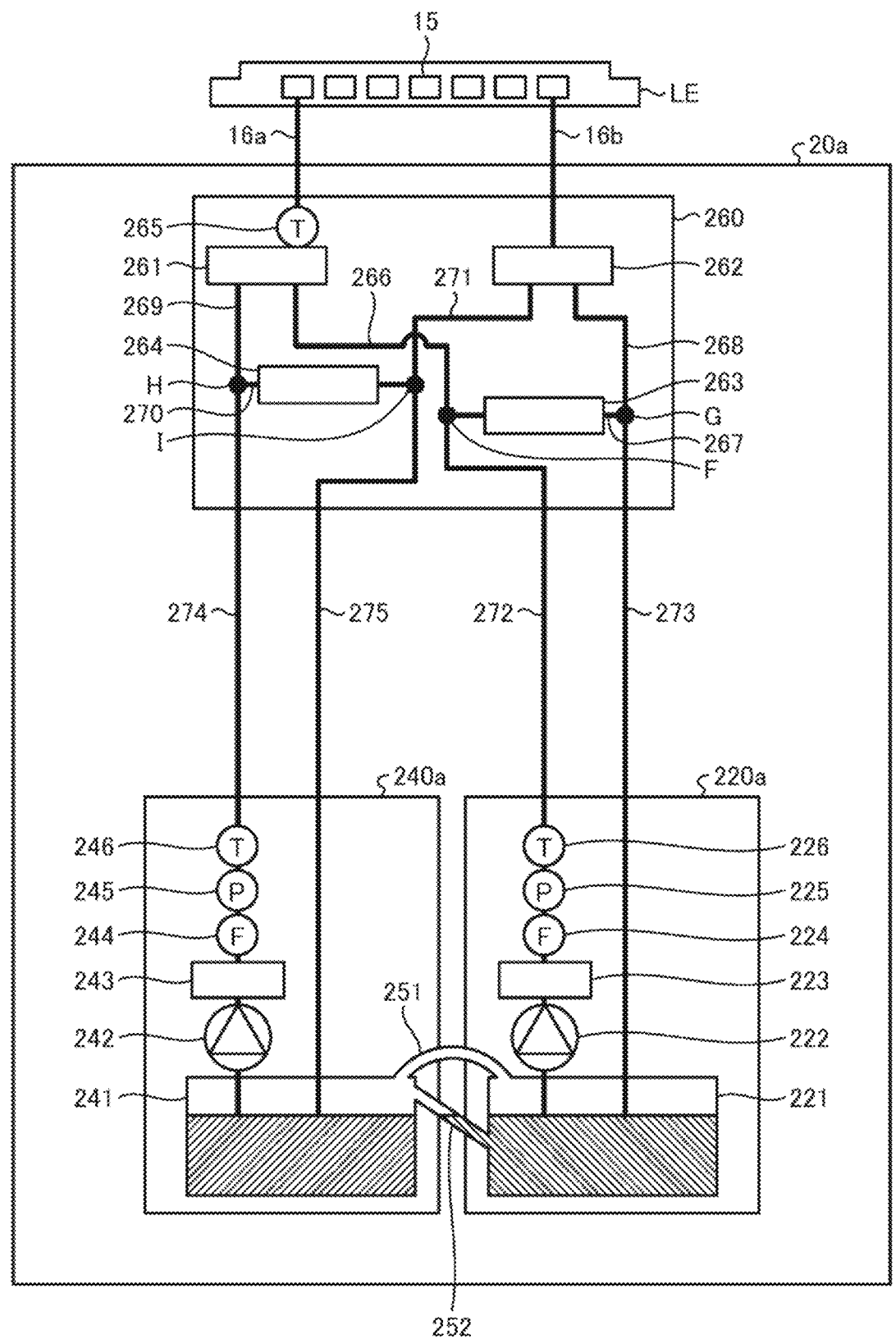
FIG. 11 is a diagram showing an example of a temperature control device according to a third modification.

FIG. 11 is a diagram showing an example of the temperature control device in the third modification. In comparison with the temperature control device 20 in the above embodiment, a temperature control device 20a shown in FIG. 11 includes a switching part 260, a first temperature controller 220a, and a second temperature controller 240a in place of the circulation part 200, the first temperature controller 220, and the second temperature controller 240. Further, the switching part 260 includes valves 261 to 264, a temperature sensor 265, and pipes 266 to 271.

The first temperature controller 220a is connected to the pipe 16a via a pipe 272, the pipe 266, and the valve 261. Further, the first temperature controller 220a is connected to the pipe 16b via a pipe 273, the pipe 268, and the valve 262. In the third modification, the first temperature controller 220a controls the temperature of the first heat medium on the high temperature side. The first temperature controller 220a supplies the temperature-controlled first heat medium into the flow path 15 of the lower electrode LE via the pipe 272, the pipe 266, the valve 261, and the pipe 16a. Then, the heat medium supplied into the flow path 15 of the lower electrode LE is returned to the first temperature controller 220a via the pipe 16b, the valve 262, the pipe 268, and the pipe 273. A pipe composed of the pipe 272, the pipe 266, and the pipe 16a is an example of a supply pipe or a first supply pipe. Further, a pipe composed of the pipe 16b, the pipe 268, and the pipe 273 is an example of a return pipe or a first return pipe.

The second temperature controller 240a is connected to the pipe 16a via a pipe 274, the pipe 269, and the valve 261. Further, the second temperature controller 240a is connected to the pipe 16b via a pipe 275, the pipe 271, and the valve 262. In the third modification, the second temperature controller 240a controls the temperature of the second heat medium on the low temperature side. The second temperature controller 240a supplies the temperature-controlled second heat medium into the flow path 15 of the lower electrode LE via the pipe 274, the pipe 269, the valve 261, and the pipe 16a. Then, the heat medium supplied into the flow path 15 of the lower electrode LE is returned to the second temperature controller 240a via the pipe 16b, the valve 262, the pipe 271, and the pipe 275. A pipe composed of the pipe 274, the pipe 269, and the pipe 16a is an example of a supply pipe or a second supply pipe. Further, a pipe composed of the pipe 16b, the pipe 271, and the pipe 275 is an example of a return pipe or a second return pipe.

The valve 261 is provided at a connection portion between the pipe 16a and the pipes 266 and 269 to switch the heat medium flowing in the flow path 15 of the lower electrode LE to the first heat medium or the second heat medium. The valve 262 is provided at a connection portion between the pipe 16b and the pipes 268 and 271 to switch an output destination of the heat medium, which flows out from the flow path 15 of the lower electrode LE, to the first temperature controller 220a or the second temperature controller 240a.

A connection position F between the pipe 272 and the pipe 266 and a connection position G between the pipe 273 and the pipe 268 are connected by the pipe 267 which is a bypass pipe. The pipe 267 is provided with a bypass valve 263.

A connection position H between the pipe 274 and the pipe 269 and a connection position I between the pipe 275 and the pipe 271 are connected by the pipe 270 which is a bypass pipe. The pipe 270 is provided with a bypass valve 264.

The pipe 16a in the temperature control device 20a is provided with the temperature sensor 265 for measuring the temperature on the inlet side of the flow path 15. The temperature sensor 265 may be provided outside the temperature control device 20a. For example, the temperature sensor 265 may be provided directly under the lower electrode LE, for example, at a connection portion between the pipe 16a and the flow path 15, or may be provided at an intermediate point between the lower electrode LE and the temperature control device 20a.

The opening/closing of the valves 261 and 262 and the bypass valves 263 and 264 are controlled by the control device 11. Since the first temperature controller 220a and the second temperature controller 240a have the same configuration as the first temperature controller 220 and the second temperature controller 240 according to the above embodiment except that the former does not the variable valves 227 and 228 and the variable valves 247 and 248, the description thereof will be omitted.

In the temperature control device 20a, when the first heat medium on the high temperature side is supplied into the flow path 15 of the lower electrode LE, the valve 261 is opened on the pipe 266 side and is closed on the pipe 269 side, and the valve 262 is opened on the pipe 268 side and is closed on the pipe 271 side. Further, the bypass valve 263 is closed, and the bypass valve 264 is opened. Therefore, the first heat medium on the high temperature side supplied from the first temperature controller 220a is supplied into the flow path 15 of the lower electrode LE and returns to the first temperature controller 220a, and the second heat medium on the low temperature side supplied from the second temperature controller 240a returns to the second temperature controller 240a via the bypass valve 264.

On the other hand, in the temperature control device 20a, when the second heat medium on the low temperature side is supplied into the flow path 15 of the lower electrode LE, the valve 261 is closed on the pipe 266 side and is opened on the pipe 269 side, and the valve 262 is closed on the pipe 268 side and is open on the pipe 271 side. Further, the bypass valve 263 is opened, and the bypass valve 264 is closed. Therefore, the second heat medium on the low temperature side supplied from the second temperature controller 240a is supplied into the flow path 15 of the lower electrode LE and returns to the second temperature controller 240a, and the first heat medium on the high temperature side supplied from the first temperature controller 220a returns to the first temperature controller 220a via the bypass valve 263.

As shown in FIG. 11, similarly to the temperature control device 20, the reservoir tank 221 on the high temperature side and the reservoir tank 241 on the low temperature side are connected by the pipe 251, which is a communication pipe for gas, and the pipe 252 which is a communication pipe of liquid (heat medium). The pipe 251 connects the ceiling surface side of the reservoir tank 221 and the ceiling surface side of the reservoir tank 241. The pipe 252 connects the position of the lower limit level of the reservoir tank 221 and the position of the upper limit level of the reservoir tank 241. Therefore, in the temperature control device 20a, similarly to the temperature control device 20, since the heat medium in the reservoir tank 221 on the high temperature side and the heat medium in the reservoir tank 241 on the low temperature side do not mix, energy loss for maintaining the temperatures in the respective heat media having a large temperature difference can be reduced. In addition, in the third modification, the middle tank 280 may be provided as in the first modification.

As described above, according to the present embodiment, each of the temperature control devices 20 and 20a includes a first tank (the reservoir tank 221) that stores the first heat medium, a second tank (the reservoir tank 241) that stores the second heat medium having a temperature different from that of the first heat medium, and a first communication pipe (the pipe 252) that connects a position where the upper limit level of the height of the liquid level is located in the first tank and a position where the lower limit level of the height of the liquid level is located in the second tank. As a result, the energy loss for maintaining the temperature of the heat media having a large temperature difference can be reduced.

Further, according to the present embodiment, each of the interiors of the first tank and the second tank includes a liquid portion and a gas portion, and a second communication pipe (the pipe 251) is formed so as to communicate the gas portion inside the first tank and the gas portion inside the second tank with each other. As a result, the heat medium can smoothly move between the tanks.

Further, according to the present embodiment, the second communication pipe is provided at a position higher than the upper limit level of each of the first tank and the second tank. As a result, a gas can move between the tanks.

Further, according to the present embodiment, the second communication pipe is provided between the ceiling surface side of the first tank and the ceiling surface side of the second tank. As a result, a gas can move between the tanks.

Further, according to the first modification, the temperature control device 20 includes a first tank (the reservoir tank 221) that stores the first heat medium, a second tank (the reservoir tank 241) that stores the second heat medium having a temperature different from that of the first heat medium, a third tank (the middle tank 280) that stores the third heat medium, a first communication pipe (the pipe 252a) that connects the first tank and the third tank, and a second communication pipe (the pipe 252b) that connects the second tank and the third tank. The first communication pipe is a communication pipe that connects a position where the upper limit level of the height of the liquid level is located in the first tank and a position where the lower limit level of the height of the liquid level is located in the third tank, or a communication pipe that connects a position where the lower limit level is located in the first tank and a position where the upper limit level is located in the third tank. Further, the second communication pipe is a communication pipe that connects the position where the upper limit level is located in the second tank and the position where the lower limit level is located in the third tank, or a communication pipe that connects the position where the lower limit level is located in the second tank and the position where the upper limit level is located in the third tank. As a result, the energy loss for maintaining the temperature of the heat media having a large temperature difference can be made smaller.

Further, according to the first modification, the bottom surface of the third tank is higher than the bottom surfaces of the first tank and the second tank. As a result, the liquid level control via the third tank (the middle tank 280) can be realized with the minimum quantity of liquid.

Further, according to the first modification, the third heat medium is at the room temperature. As a result, the energy loss for maintaining the temperature of the heat media having a large temperature difference can be made smaller.

Further, according to the first modification, the temperature of the third tank is not controlled. As a result, it is not necessary to consume energy to maintain the temperature of the heat medium stored in the third tank (the middle tank 280).

Further, according to the first modification, each of the interiors of the first tank, the second tank, and the third tank includes a liquid portion and a gas portion, a third communication pipe (the pipe 251a) is formed so as to communicate the gas portion inside the first tank and the gas portion inside the third tank with each other, and a fourth communication pipe (the pipe 251b) is formed so as to communicate the gas portion inside the second tank and the gas portion inside the third tank with each other. As a result, the heat medium can smoothly move between the tanks.

Further, according to the first modification, the third communication pipe is provided at a position higher than the upper limit level of each of the first tank and the third tank, and the fourth communication pipe is provided at a position higher than the upper limit of each of the second tank and the third tank. As a result, a gas can move between the tanks.

Further, according to the first modification, the third communication pipe is provided between the ceiling surface side of the first tank and the ceiling surface side of the third tank, and the fourth communication pipe is provided between the ceiling surface side of the second tank and the ceiling surface side of the third tank. As a result, a gas can move between the tanks.

The embodiments disclosed this time should be considered to be exemplary in all respects and not restrictive. The above embodiments may be omitted, replaced, or modified in various forms without departing from the appended claims and the gist thereof.

Further, in the above embodiments, capacitively-coupled plasma (CCP) is used as an example of the plasma source, but the disclosed technique is not limited thereto. As the plasma source, for example, inductively-coupled plasma (ICP), microwave-excited surface wave plasma (SWP), electron cyclotron resonance plasma (ECP), helicon wave-excited plasma (HWP), or the like may be used.

Further, in the above embodiments, the plasma etching processing apparatus has been described as an example of the substrate processing apparatus 1, but the disclosed technique is not limited thereto. If the substrate processing apparatus 1 is an apparatus for controlling the temperature of a temperature control object such as the wafer W by using a temperature-controlled heat medium, the disclosed techniques can be applied not only for the etching apparatus but also for a film forming apparatus, a modifying apparatus, a cleaning apparatus, and the like.

According to the present disclosure in some embodiments, it is possible to reduce energy loss for maintaining a temperature of heat media having a large temperature difference.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature control device comprising:
a first tank that stores a first heat medium;
a second tank that stores a second heat medium having a temperature different from a temperature of the first heat medium; and
a first communication pipe configured to connect a first position of the first tank and a second position of the second tank which is lower than the first position, and to be a flow path through which the first heat medium flows to the second tank and the second heat medium flows to the first tank according to a level difference between the first heat medium and the second heat medium,
wherein each of the interiors of the first tank and the second tank includes a liquid portion and a gas portion, and
the temperature control device further comprises: a second communication pipe formed to communicate the gas portion in the interior of the first tank and the gas portion in the interior of the second tank with each other.

2. The temperature control device of Claim 1, wherein the second communication pipe is provided at a position higher than an upper limit level of a height of a liquid level in each of the first tank and the second tank.

3. The temperature control device of claim 2, wherein the second communication pipe is provided between a ceiling surface side of the first tank and a ceiling surface side of the second tank.

4. A substrate processing apparatus comprising:
a process container;
a stage provided inside the process container and configured to place a substrate thereon;
a first temperature controller configured to supply a first heat medium from a first tank that stores the first heat medium to a flow path provided inside the stage via a first pipe;
a second temperature controller configured to supply a second heat medium having a temperature different from a temperature of the first heat medium from a second tank that stores the second heat medium to the flow path via a second pipe; and
a first communication pipe configured to connect a first position of the first tank and a second position of the second tank which is lower than the first position, and to be a flow path through which the first heat medium flows to the second tank and the second heat medium flows to the first tank according to a level difference between the first heat medium and the second heat medium.

5. The substrate processing apparatus of claim 4, wherein each of the interiors of the first tank and the second tank includes a liquid portion and a gas portion, and
the substrate processing apparatus further comprises: a second communication pipe formed to communicate the gas portion in the interior of the first tank and the gas portion in the interior of the second tank with each other.

6. The substrate processing apparatus of claim 5, wherein the second communication pipe is provided at a position higher than an upper limit level of a height of a liquid level in each of the first tank and the second tank.

7. The substrate processing apparatus of claim 6, wherein the second communication pipe is provided between a ceiling surface side of the first tank and a ceiling surface side of the second tank.

* * * * *